United States Patent
Choi et al.

(10) Patent No.: US 10,002,651 B2
(45) Date of Patent: Jun. 19, 2018

(54) SEMICONDUCTOR DEVICES

(71) Applicant: SK hynix Inc., Icheon-si, Gyeonggi-do (KR)

(72) Inventors: Geun Ho Choi, Icheon-si (KR); Dong Kyun Kim, Cheongju-si (KR); Jae Il Kim, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days. days.

(21) Appl. No.: 15/609,378

(22) Filed: May 31, 2017

(65) Prior Publication Data

US 2018/0102150 A1   Apr. 12, 2018

(30) Foreign Application Priority Data

Oct. 6, 2016   (KR) .................. 10-2016-0129368
Oct. 6, 2016   (KR) .................. 10-2016-0129369

(51) Int. Cl.
*G11C 7/22* (2006.01)
*G11C 7/10* (2006.01)

(52) U.S. Cl.
CPC .............. *G11C 7/222* (2013.01); *G11C 7/106* (2013.01); *G11C 7/109* (2013.01); *G11C 7/1087* (2013.01); *G11C 7/22* (2013.01)

(58) Field of Classification Search
CPC .................................. G11C 7/106; G11C 7/22
USPC ............................ 365/189.05, 185.24, 233.5
See application file for complete search history.

(56) References Cited

U.S. PATENT DOCUMENTS

| | | | | |
|---|---|---|---|---|
| 5,497,450 A | * | 3/1996 | Helmbold | G06K 1/121 358/1.1 |
| 6,026,230 A | * | 2/2000 | Lin | G06F 17/5022 703/13 |
| 6,172,537 B1 | * | 1/2001 | Kanou | G06F 1/10 327/149 |
| 6,356,508 B1 | * | 3/2002 | Yoshimoto | G11C 7/1072 365/189.05 |
| 8,242,819 B2 | * | 8/2012 | Bae | G11C 7/22 327/147 |
| 9,318,177 B2 | * | 4/2016 | Ko | G11C 8/06 |
| 2007/0101177 A1 | * | 5/2007 | Kuroki | G06F 1/06 713/500 |

(Continued)

FOREIGN PATENT DOCUMENTS

| KR | 1020150106524 A | 9/2015 |
| KR | 1020160071769 A | 6/2016 |
| KR | 1020160087945 A | 7/2016 |

*Primary Examiner* — Michael Tran
(74) *Attorney, Agent, or Firm* — William Park & Associates Ltd.

(57) ABSTRACT

A semiconductor device may include a valid command generation circuit and a training control circuit. The valid command generation circuit may be configured to latch an internal chip selection signal and an internal control signal in synchronization with a division clock signal to generate a latch chip selection signal and a latch control signal. The valid command generation circuit may be configured to generate a valid command for executing a predetermined function from the latch control signal. The training control circuit may be configured to generate a training result signal from the latch chip selection signal or the latch control signal based on a flag.

31 Claims, 13 Drawing Sheets

(56) References Cited

U.S. PATENT DOCUMENTS

| | | | |
|---|---|---|---|
| 2009/0265494 A1* | 10/2009 | Toki | G06F 13/4045 |
| | | | 710/110 |
| 2009/0327792 A1* | 12/2009 | Salmon | G06F 1/06 |
| | | | 713/501 |
| 2011/0164103 A1* | 7/2011 | Kii | B41J 2/45 |
| | | | 347/118 |
| 2012/0268170 A1* | 10/2012 | Kondo | H03K 21/10 |
| | | | 327/115 |
| 2013/0182524 A1* | 7/2013 | Jeon | G11C 7/222 |
| | | | 365/233.11 |
| 2014/0056085 A1* | 2/2014 | Kang | H03L 7/0802 |
| | | | 365/191 |
| 2015/0009774 A1* | 1/2015 | Ko | G11C 8/06 |
| | | | 365/230.08 |
| 2016/0172013 A1 | 6/2016 | Dearth et al. | |
| 2016/0226495 A1* | 8/2016 | Fujisawa | H03K 23/40 |

* cited by examiner

FIG. 6

| Valid Command Function | CA Pins | | | | | | | | | | | | | |
|---|---|---|---|---|---|---|---|---|---|---|---|---|---|---|
| | CA0 | CA1 | CA2 | CA3 | CA4 | CA5 | CA6 | CA7 | CA8 | CA9 | CA10 | CA11 | CA12 | CA13 |
| CA Vref setting during training mode | H | H | L | H | L | L | CA Vref setting | | | | | | | |
| CA ODT setting during training mode | H | H | L | H | L | H | CA ODT setting | | | | | | | |
| CS training mode enable | H | H | L | H | H | L | L | | | | | | | |
| CS training mode disable | H | H | L | H | H | L | H | | | | | | | |
| CA training mode enable | H | H | L | H | H | H | L | | | | | | | |
| CA training mode disable | H | H | L | H | H | H | H | | | | | | | |

SEMICONDUCTOR DEVICES

CROSS-REFERENCE TO RELATED APPLICATION

The present application claims priority under 35 U.S.C 119(a) to Korean Application No. 10-2016-0129368 filed on Oct. 6, 2016 and Korean Application No. 10-2016-0129369 filed on Oct. 6, 2016, which are herein incorporated by references in their entirety.

BACKGROUND

1. Technical Field

Embodiments of the present disclosure may generally relate to semiconductor devices relating to the execution of a training operation.

2. Related Art

Mobile systems such as portable computers, personal digital assistants (PDAs) and portable phones have been developed to reduce the weight thereof for portability. Batteries supplying electric power to the mobile systems may largely affect the total weight of the mobile systems. If power consumption of semiconductor devices employed in the mobile systems is lowered, the capacity of the batteries may also be reduced to thus decrease the total weight of the mobile systems. Fast mobile systems are increasingly in demand with the development of multi-functional mobile systems. Accordingly, data transmission speeds of the semiconductor devices such as mobile memory devices (also, referred to as 'mobile memory chips') may be important factors in the determination of operation speeds of the high performance mobile systems.

Recently, the semiconductor devices have been designed to simultaneously receive a command and an address through a plurality of pins. In such a case, signals inputted through the plurality of pins may include all information on the command and the address, and a command decoder and an address decoder may decode the singles inputted through the plurality of pins to extract the command and the address.

With regards to synchronous semiconductor devices, the command and the address may be inputted in synchronization with a clock signal. For example, double data rate (DDR) semiconductor devices may receive the command and the address in synchronization with a rising edge and a falling edge of the clock signal, and single data rate (SDR) semiconductor devices may receive the command and the address in synchronization with a rising edge of the clock signal.

SUMMARY

According to an embodiment, a semiconductor device may be provided. The semiconductor device may include a valid command generation circuit and a training control circuit. The valid command generation circuit may be configured to latch an internal chip selection signal and an internal control signal in synchronization with a division clock signal to generate a latch chip selection signal and a latch control signal. The valid command generation circuit may be configured to generate a valid command for executing a predetermined function from the latch control signal. The training control circuit may be configured to generate a training result signal from the latch chip selection signal or the latch control signal based on a flag.

According to an embodiment, a semiconductor device may include a valid command generation circuit and a training control circuit. The valid command generation circuit may be configured to latch an internal control signal in synchronization with a division clock signal to generate a latch control signal and generate a valid command for executing a predetermined function from the latch control signal. The training control circuit may be configured to generate a training result signal from the latch control signal based on a flag.

According to an embodiment, a semiconductor device may include a valid command generation circuit configured to latch an internal chip selection signal and an internal control signal in synchronization with a division clock signal to generate a latch chip selection signal and a latch control signal and configured to generate a valid command for executing a predetermined function from the latch control signal. The semiconductor device may include a reset pulse generation circuit configured to generate a reset pulse based on an internal chip selection signal, and a training control circuit configured to generate a training result signal from the latch control signal based on a flag and configured to initialize the training result signal based on the reset pulse.

According to an embodiment, a semiconductor device may include a valid command generation circuit configured to latch an internal control signal in synchronization with a division clock signal to generate a latch control signal and configured to generate a valid command for executing a predetermined function from the latch control signal. The semiconductor device may include a reset pulse generation circuit configured to generate a reset pulse based on an internal chip selection signal. The semiconductor device may include a training control circuit configured to generate a training result signal from the latch control signal based on a flag and configured to initialize the training result signal based on the reset pulse.

BRIEF DESCRIPTION OF THE DRAWINGS

FIG. 6 is a table, which is published by the joint electron device engineering council (JEDEC) standard, illustrating functions of a valid command executed according to a logic level combination of bits included in a control signal.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Various embodiments may be directed to semiconductor devices executing a training operation.

Figure 1:
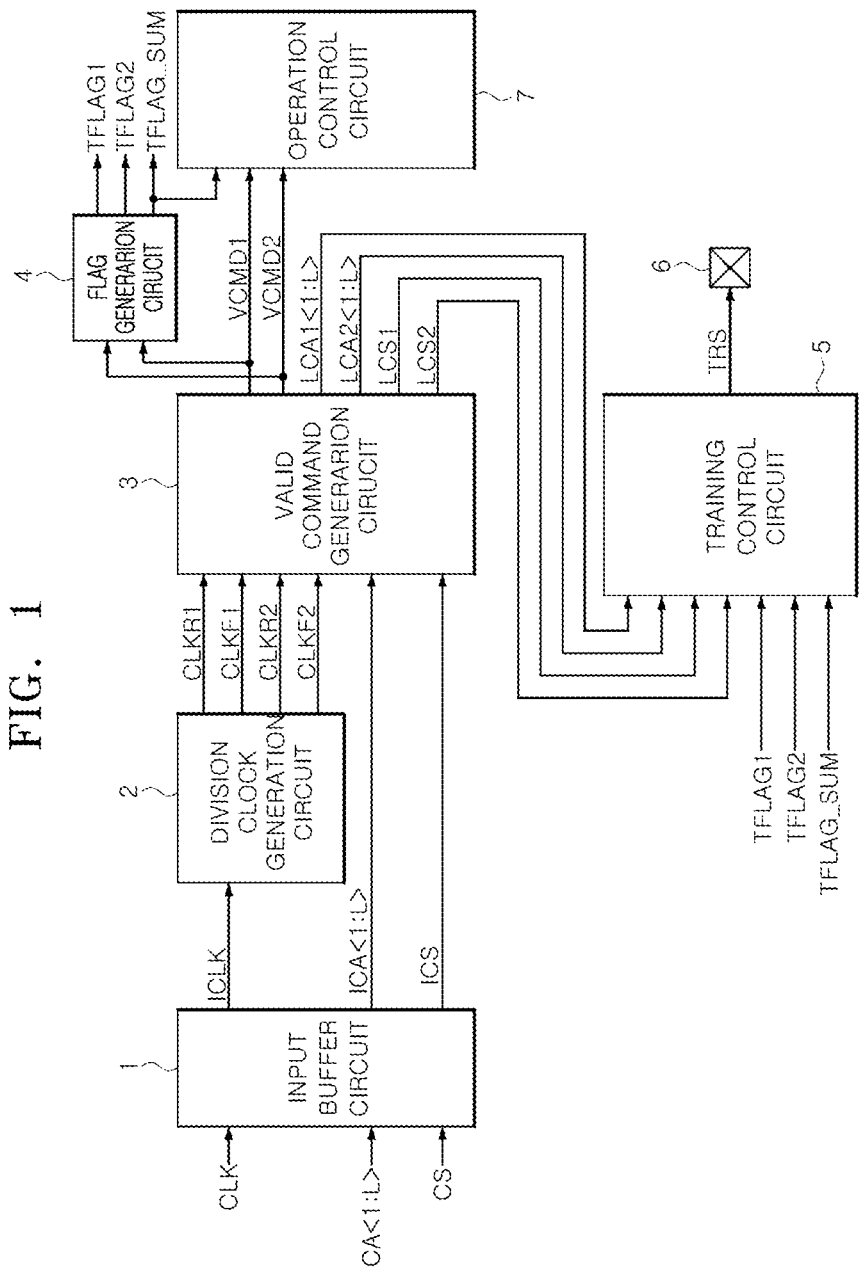
FIG. 1 is a block diagram illustrating a representation of an example of a configuration of a semiconductor device according to an embodiment.

Referring to FIG. 1, a semiconductor device according to an embodiment may include an input buffer circuit 1, a division clock generation circuit 2, a valid command generation circuit 3, a flag generation circuit 4, a training control circuit 5, an output pad 6 and an operation control circuit 7.

The input buffer circuit 1 may generate an internal clock signal ICLK, an internal control signal ICA<1:L> and an internal chip selection signal ICS in response to a clock signal CLK, a control signal CA<1:L> and a chip selection signal CS. The clock signal CLK may be provided by a controller (not illustrated) or a host (not illustrated) disposed at an outside region of the semiconductor device. The control signal CA<1:L> may be inputted to the input buffer circuit 1 through a line (not illustrated) that transmits a command or an address. The control signal CA<1:L> may be provided by the controller (not illustrated) or the host (not illustrated) disposed at an outside region of the semiconductor device. The chip selection signal CS may be enabled so that the semiconductor device is selected to execute a specific function. The chip selection signal CS may be provided by the controller (not illustrated) or the host (not illustrated) disposed at an outside region of the semiconductor device. The input buffer circuit 1 may include a buffer (not illustrated) that buffers the clock signal CLK to generate the internal clock signal ICLK. The input buffer circuit 1 may include a buffer (not illustrated) that buffers the control signal CA<1:L> to generate the internal control signal ICA<1:L>. The input buffer circuit 1 may include a buffer (not illustrated) that buffers the chip selection signal CS to generate the internal chip selection signal ICS.

The division clock generation circuit 2 may generate a first division clock signal CLKR1, a second division clock signal CLKF1, a third division clock signal CLKR2 and a fourth division clock signal CLKF2 from the internal clock signal ICLK. The first to fourth division clock signals CLKR1, CLKF1, CLKR2 and CLKF2 may be generated to be 2-division signals of the internal clock signal ICLK. That is, the first to fourth division clock signals CLKR1, CLKF1, CLKR2 and CLKF2 may be generated to have a cycle time which is twice a cycle time of the internal clock signal ICLK. In some embodiments, the first to fourth division clock signals CLKR1, CLKF1, CLKR2 and CLKF2 may be generated to be 'N'-division signals of the internal clock signal ICLK (wherein, 'N' denotes a natural number which is greater than three). The first and third division clock signals CLKR1 and CLKR2 may be generated in synchronization with rising edges of the internal clock signal ICLK, and the second and fourth division clock signals CLKF1 and CLKF2 may be generated in synchronization with falling edges of the internal clock signal ICLK. A phase of the first division clock signal CLKR1 may be set to precede a phase of the second division clock signal CLKF1 by 90 degrees. A phase of the second division clock signal CLKF1 may be set to precede a phase of the third division clock signal CLKR2 by 90 degrees. A phase of the third division clock signal CLKR2 may be set to precede a phase of the fourth division clock signal CLKF2 by 90 degrees. Even though a phase difference between the first to fourth division clock signals CLKR1, CLKF1, CLKR2 and CLKF2 is set to be 90 degrees in a present embodiment, the phase difference between the first to fourth division clock signals CLKR1, CLKF1, CLKR2 and CLKF2 may be set to be different according to the embodiments. In an embodiment, for example, the division clock signals (i.e., the first to fourth division clock signals CLKR1, CLKF1, CLKR2 and CLKF2) may be generated by dividing the clock signal CLK and a cycle of the division clock signals may be 'N' times a cycle of the clock signal CLk (wherein, 'N' denotes a natural number).

The valid command generation circuit 3 may generate a first latch control signal LCA1<1:L>, a second latch control signal LCA2<1:L>, a first latch chip selection signal LCS1, a second latch chip selection signal LCS2, a first valid command VCMD1 and a second valid command VCMD2 from the internal control signal ICA<1:L> and the internal chip selection signal ICS in synchronization with the first to fourth division clock signals CLKR1, CLKF1, CLKR2 and CLKF2. The valid command generation circuit 3 may latch the internal chip selection signal ICS to generate the first latch chip selection signal LCS1 in synchronization with the first division clock signal CLKR1. The valid command generation circuit 3 may latch the internal chip selection signal ICS to generate the second latch chip selection signal LCS2 in synchronization with the third division clock signal CLKR2. The valid command generation circuit 3 may latch the internal control signal ICA<1:L> to generate the first latch control signal LCA1<1:L> in synchronization with the first division clock signal CLKR1 and the first latch chip selection signal LCS1. The valid command generation circuit 3 may latch the internal control signal ICA<1:L> to generate the second latch control signal LCA2<1:L> in synchronization with the third division clock signal CLKR2 and the second latch chip selection signal LCS2. The valid command generation circuit 3 may generate the first valid command VCMD1 in synchronization with the second division clock signal CLKF1, if the first latch control signal LCA1<1:L> and the second latch control signal LCA2<1:L> have the same logic level combination. The valid command generation circuit 3 may generate the second valid command VCMD2 in synchronization with the fourth division clock signal CLKF2, if the first latch control signal LCA1<1:L> and the second latch control signal LCA2<1:L> have the same logic level combination. The valid command generation circuit 3 may generate the first valid command VCMD1 or the second valid command VCMD2 for executing a predetermined function, if the internal control signal ICA<1:L> is inputted to the valid command generation circuit 3 without any variation of a logic level combination in synchronization with the internal chip selection signal ICS for two cycles of the internal clock signal ICLK. In a present embodiment, the first and second valid command VCMD1 and VCMD2, which are enabled, may be generated if the internal control signal ICA<1:L> is inputted to the valid command generation circuit 3 without any variation of a logic level combination in synchronization with the internal chip selection signal ICS for two cycles of the internal clock signal ICLK. In some embodiments, the first and second valid command VCMD1 and VCMD2 may be generated, even though the internal control signal ICA<1:L> is inputted to the valid command generation circuit 3 without any variation of a logic level combination for two cycles of the internal clock signal ICLK regardless of the internal chip selection signal ICS. In an embodiment, a valid command (i.e., first or second valid commands VCMD1 VCMD2) is enabled if a logic level combination of a latch control signal (i.e., first latch control signal LCA1<1:L> or the second latch control signal LCA2<1:L>) is fixed for "N" times a cycle of a clock signal (i.e., CLK), wherein "N" is a natural number. A logic level of the first and second valid commands VCMD1 and VCMD2 which are enabled may be set to be different according to the embodiments.

The flag generation circuit 4 may generate a first flag TFLAG1, a second flag TFLAG2 and a synthesis flag TFLAG_SUM in response to the first and second valid commands VCMD1 and VCMD2. The flag generation circuit 4 may generate the first flag TFLAG1 or the second flag TFLAG2 which is enabled if the first or second valid command VCMD1 or VCMD2 is enabled to execute a predetermined function. For example, the flag generation circuit 4 may generate the first flag TFLAG1 which is enabled if the first or second valid command VCMD1 or VCMD2 is enabled for execution of a chip selection signal training entry function and may generate the second flag TFLAG2 which is enabled if the first or second valid command VCMD1 or VCMD2 is enabled for execution of a control signal training entry function. The flag generation circuit 4 may generate the synthesis flag TFLAG_SUM which is enabled if the first or second valid command VCMD1 or VCMD2 is enabled. A logic level of the first flag TFLAG1, the second flag TFLAG2 and the synthesis flag TFLAG_SUM which are enabled may be set to be different according to the embodiments.

The training control circuit 5 may generate a training result signal TRS from the first latch control signal LCA1<1:L>, the second latch control signal LCA2<1:L>, the first latch chip selection signal LCS1 and the second latch chip selection signal LCS2, in response to the first flag TFLAG1, the second flag TFLAG2 and the synthesis flag TFLAG_SUM. The training control circuit 5 may generate the training result signal TRS from the first latch chip selection signal LCS1 or the second latch chip selection signal LCS2 if the first flag TFLAG1 and the synthesis flag TFLAG_SUM are enabled by execution of the chip selection signal training entry function. The chip selection signal training entry function may be executed to control an enablement timing of the chip selection signal CS according to a logic level of the first or second latch chip selection signal LCS1 or LCS2 which is outputted as the training result signal TRS while logic level combinations of the first and second latch control signals LCA1<1:L> and LCA2<1:L> are fixed. The training control circuit 5 may generate the training result signal TRS from the first latch control signal LCA1<1:L> or the second latch control signal LCA2<1:L> if the second flag TFLAG2 and the synthesis flag TFLAG_SUM are enabled by execution of the control signal training entry function. The control signal training entry function may be executed to control an input timing of the control signal CA<1:L> by sensing a logic level combination of the first or second latch control signal LCA1<1:L> or LCA2<1:L> which is outputted as the training result signal TRS in synchronization with a point of time that the trained chip selection signal CS is enabled. The training control circuit 5 may output the training result signal TRS through the output pad 6. In some embodiments, the output pad 6 may be realized using a pad through which data are outputted.

The operation control circuit 7 may receive the first and second valid commands VCMD1 and VCMD2 to execute predetermined function. The predetermined function executed by the first and second valid commands VCMD1 and VCMD2 may include a control signal reference voltage setting function, a control signal termination resistance setting function, the chip selection signal training entry function, a chip selection signal training exit function, the control signal training entry function, and a control signal training exit function. The control signal reference voltage setting function may be executed by an operation that sets a level of a reference voltage which is used to buffer the control signal CA<1:L> in an input buffer (not illustrated) through which the control signal CA<1:L> is inputted during a training operation. The control signal termination resistance setting function may be executed by an operation that sets a resistance value of a termination resistor connected to a pad (not illustrated) to which the control signal is inputted during the training operation. The chip selection signal training entry function may be executed to enter the chip selection signal training mode, and the chip selection signal training exit function may be executed to terminate the chip selection signal training mode. The control signal training entry function may be executed to enter the control signal training mode, and the control signal training exit function may be executed to terminate the control signal training mode. Although each of the first and second valid commands VCMD1 and VCMD2 is illustrated and described as a single signal in a present embodiment, each of the first and second valid commands VCMD1 and VCMD2 may be realized to include a plurality of signals corresponding to different functions according to the embodiments.

Figure 2:
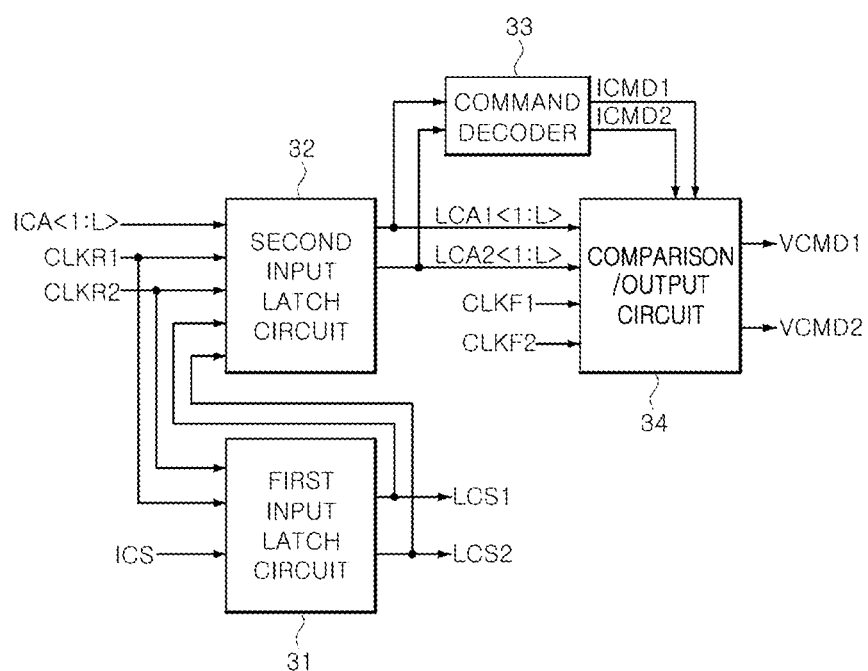
FIG. 2 is a block diagram illustrating a representation of an example of a valid command generation circuit included in the semiconductor device of FIG. 1.

Referring to FIG. 2, the valid command generation circuit 3 may include a first input latch circuit 31, a second input latch circuit 32, a command decoder 33 and a comparison/output circuit 34.

The first input latch circuit 31 may generate the first and second latch chip selection signal LCS1 or LCS2 from the internal chip selection signal ICS in response to the first division clock signal CLKR1 and the third division clock signal CLKR2. The first input latch circuit 31 may latch the internal chip selection signal ICS to generate the first latch chip selection signal LCS1, in synchronization with the first division clock signal CLKR1. The first input latch circuit 31 may latch the internal chip selection signal ICS to generate the second latch chip selection signal LCS2, in synchronization with the third division clock signal CLKR2.

The second input latch circuit 32 may generate the first or second latch control signal LCA1<1:L> or LCA2<1:L> from the internal control signal ICA<1:L> in response to the first and third division clock signals CLKR1 and CLKR2 and the first and second latch chip selection signals LCS1 and LCS2. The second input latch circuit 32 may latch the internal control signal ICA<1:L> to generate the first latch control signal LCA1<1:L> in synchronization with the first division clock signal CLKR1 while the first latch chip selection signal LCS1 is enabled. The second input latch circuit 32 may latch the internal control signal ICA<1:L> to generate the second latch control signal LCA2<1:L> in synchronization with third division clock signal CLKR2 while the second latch chip selection signal LCS2 is enabled.

The command decoder 33 may generate a first internal command ICMD1 or a second internal command ICMD2 in response to the first and second latch control signals LCA1<1:L> and LCA2<1:L>. The command decoder 33 may decode the first latch control signal LCA1<1:L> to generate the first internal command ICMD1. The first internal command ICMD1 may be enabled to execute the predetermined function. The predetermined function may include, for example but not limited to, a control signal reference voltage setting function, a control signal termination resistance setting function, the chip selection signal training entry function, a chip selection signal training exit function, the control signal training entry function, and a control signal training exit function. The command decoder 33 may decode the second latch control signal LCA2<1:L> to generate the second internal command ICMD2. The second internal command ICMD2 may be enabled to execute the predetermined function.

The comparison/output circuit 34 may compare the first latch control signal LCA1<1:L> with the second latch control signal LCA2<1:L> in synchronization with the second division clock signal CLKF1 and the fourth division clock signal CLKF2 and may generate the first valid command VCMD1 from the first and second internal commands ICMD1 and ICMD2 according to the comparison result. The comparison/output circuit 34 may output the first internal command ICMD1 as the first valid command VCMD1, if the first and the second latch control signals LCA1<1:L> and LCA2<1:L> have the same logic level combination in synchronization with the second division clock signal CLKF1. The comparison/output circuit 34 may output the second internal command ICMD2 as the second valid command VCMD2, if the first and the second latch control signals LCA1<1:L> and LCA2<1:L> have the same logic level combination in synchronization with the fourth division clock signal CLKF2. A configuration and an operation of the comparison/output circuit 34 will be described more fully hereinafter with reference to FIG. 3.

Figure 3:
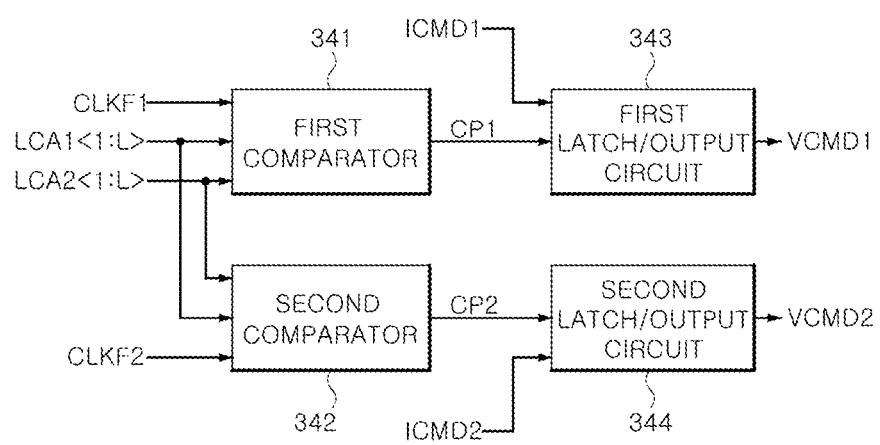
FIG. 3 is a block diagram illustrating a representation of an example of a comparison and output (comparison/output) circuit included in the valid command generation circuit of FIG. 2.

Referring to FIG. 3, the comparison/output circuit 34 may include a first comparator 341, a second comparator 342, a first latch/output circuit 343 and a second latch/output circuit 344.

The first comparator 341 may compare the first latch control signal LCA1<1:L> with the second latch control signal LCA2<1:L> to generate a first comparison pulse CP1, in synchronization with the second division clock signal CLKF1. The first comparator 341 may generate the first comparison pulse CP1 which is enabled if the first and second latch control signals LCA1<1:L> and LCA2<1:L> inputted in synchronization with the second division clock signal CLKF1 have the same logic level combination. In a present embodiment, the enablement of the first comparison pulse CP1 means generation of a pulse. However, in some other embodiments, the first comparison pulse CP1 which is enabled may correspond to a signal having a specific logic level.

The second comparator 342 may compare the first latch control signal LCA1<1:L> with the second latch control signal LCA2<1:L> to generate a second comparison pulse CP2, in synchronization with the fourth division clock signal CLKF2. The second comparator 342 may generate the second comparison pulse CP2 which is enabled if the first and second latch control signals LCA1<1:L> and LCA2<1:L> inputted in synchronization with the fourth division clock signal CLKF2 have the same logic level combination. In a present embodiment, the enablement of the second comparison pulse CP2 means generation of a pulse. However, in some other embodiments, the second comparison pulse CP2 which is enabled may correspond to a signal having a specific logic level.

The first latch and output (latch/output) circuit 343 may generate the first valid command VCMD1 from the first internal command ICMD1 in response to the first comparison pulse CP1. The first latch/output circuit 343 may latch the first internal command ICMD1 to output the latched first internal command as the first valid command VCMD1 if the first comparison pulse CP1 is enabled. In an embodiment, for example, the first internal command ICMD1 is generated by decoding the first latch control signal LCA1<1:L>.

The second latch/output circuit 344 may generate the second valid command VCMD2 from the second internal command ICMD2 in response to the second comparison pulse CP2. The second latch/output circuit 344 may latch the second internal command ICMD2 to output the latched second internal command as the second valid command VCMD2 if the second comparison pulse CP2 is enabled.

Figure 4:
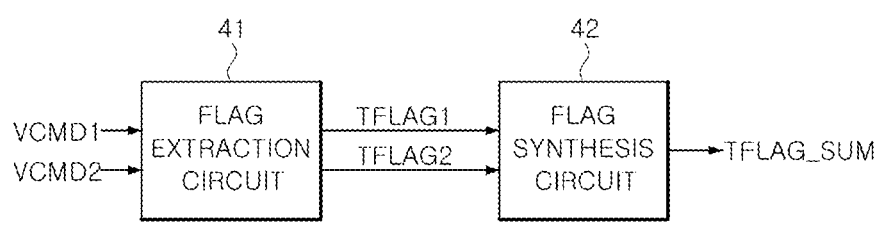
FIG. 4 is a block diagram illustrating a representation of an example of a flag generation circuit included in the semiconductor device of FIG. 1.

Referring to FIG. 4, the flag generation circuit 4 may include a flag extraction circuit 41 and a flag synthesis circuit 42.

The flag extraction circuit 41 may generate the first flag TFLAG1 or the second flag TFLAG2 in response to the first valid command VCMD1 and the second valid command VCMD2. The flag extraction circuit 41 may generate the first flag TFLAG1 which is enabled if the first valid command VCMD1 or the second valid command VCMD2 is enabled to execute the chip selection signal training entry function. The flag extraction circuit 41 may generate the second flag TFLAG2 which is enabled if the first valid command VCMD1 or the second valid command VCMD2 is enabled to execute the control signal training entry function.

The flag synthesis circuit 42 may generate the synthesis flag TFLAG_SUM in response to the first flag TFLAG1 and the second flag TFLAG2. The flag synthesis circuit 42 may generate the synthesis flag TFLAG_SUM if the first flag TFLAG1 or the second flag TFLAG2 is enabled.

Figure 5:
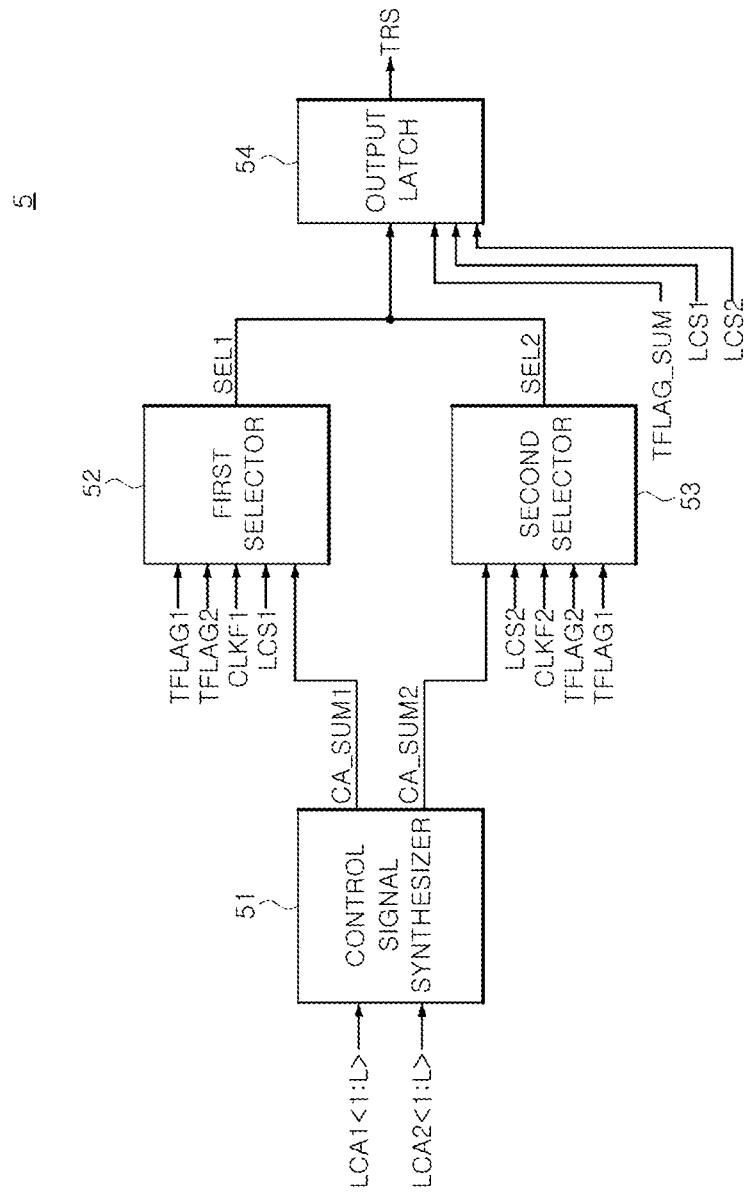
FIG. 5 is a block diagram illustrating a representation of an example of a training control circuit included in the semiconductor device of FIG. 1.

Referring to FIG. 5, the training control circuit 5 may include a control signal synthesizer 51, a first selector 52, a second selector 53 and an output latch 54.

The control signal synthesizer 51 may synthesize the first latch control signal LCA1<1:L> and the second latch control signal LCA2<1:L> to generate a first synthesis control signal CA_SUM1 and a second synthesis control signal CA_SUM2. The control signal synthesizer 51 may synthesize the first latch control signal LCA1<1:L> to generate the first synthesis control signal CA_SUM1. The first synthesis control signal CA_SUM1 may be generated to have a logic level which is set according to a logic level combination of bits included in the first latch control signal LCA1<1:L>. For example, the first synthesis control signal CA_SUM1 may be set to have a logic "high" level if all of the bits included in the first latch control signal LCA1<1:L> have the same logic level and may be set to have a logic "low" level if at least one of the bits included in the first latch control signal LCA1<1:L> has a different logic level from the other bits included in the first latch control signal LCA1<1:L>. The control signal synthesizer 51 may synthesize the second latch control signal LCA2<1:L> to generate the second synthesis control signal CA_SUM2. The second synthesis control signal CA_SUM2 may be generated to have a logic level which is set according to a logic level combination of bits included in the second latch control signal LCA2<1:L>. For example, the second synthesis control signal CA_SUM2 may be set to have a logic "high" level if all of the bits included in the second latch control signal LCA2<1:L> have the same logic level and may be set to have a logic "low" level if at least one of the bits included in the second latch control signal LCA2<1:L> has a different logic level from the other bits included in the second latch control signal LCA2<1:L>. Further, the logic levels of the signals may be different from or the opposite of those described. For example, a signal described as having a logic "high" level may alternatively have a logic "low" level, and a signal described as having a logic "low" level may alternatively have a logic "high" level.

The first selector 52 may output the first latch chip selection signal LCS1 or the first synthesis control signal CA_SUM1 as a first selection signal SEL1 in response to the first flag TFLAG1, the second flag TFLAG2 and the second division clock signal CLKF1. The first selector 52 may latch the first latch chip selection signal LCS1 or the first synthesis control signal CA_SUM1 to output the latched signal as the first selection signal SEL1 in synchronization with the second division clock signal CLKF1, while the first flag TFLAG1 or the second flag TFLAG2 is enabled. The first selector 52 may latch the first latch chip selection signal LCS1 to output the latched signal as the first selection signal SEL1 in synchronization with the second division clock signal CLKF1, while the first flag TFLAG1 is enabled to execute the chip selection signal training entry function. The first selector 52 may latch the first synthesis control signal CA_SUM1 to output the latched signal as the first selection signal SEL1 in synchronization with the second division clock signal CLKF1, while the second flag TFLAG2 is enabled to execute the control signal training entry function.

The second selector 53 may output the second latch chip selection signal LCS2 or the second synthesis control signal CA_SUM2 as a second selection signal SEL2 in response to the first flag TFLAG1, the second flag TFLAG2 and the fourth division clock signal CLKF2. The second selector 53 may latch the second latch chip selection signal LCS2 or the second synthesis control signal CA_SUM2 to output the latched signal as the second selection signal SEL2 in synchronization with the fourth division clock signal CLKF2, while the first flag TFLAG1 or the second flag TFLAG2 is enabled. The second selector 53 may latch the second latch chip selection signal LCS2 to output the latched signal as the second selection signal SEL2 in synchronization with the fourth division clock signal CLKF2, while the first flag TFLAG1 is enabled to execute the chip selection signal training entry function. The second selector 53 may latch the second synthesis control signal CA_SUM2 to output the latched signal as the second selection signal SEL2 in synchronization with the fourth division clock signal CLKF2, while the second flag TFLAG2 is enabled to execute the control signal training entry function.

The output latch 54 may output the first selection signal SEL1 or the second selection signal SEL2 as the training result signal TRS in response to the synthesis flag TFLAG_SUM, the first latch chip selection signal LCS1 and the second latch chip selection signal LCS2. The output latch 54 may output the first selection signal SEL1 as the training result signal TRS if the first latch chip selection signal LCS1 is enabled, while the synthesis flag TFLAG_SUM is enabled to execute the chip selection signal training entry function or the control signal training entry function. The output latch 54 may output the second selection signal SEL2 as the training result signal TRS if the second latch chip selection signal LCS2 is enabled, while the synthesis flag TFLAG_SUM is enabled.

Referring to FIG. 6, a table published by the joint electron device engineering council (JEDEC) standard is illustrated to show various functions of the valid command, which are executed according to a logic level combination of bits CA0~CA13 included in the control signal CA. The functions of the valid command may include the control signal reference voltage setting function, the control signal termination resistance setting function, the chip selection signal training entry function, the chip selection signal training exit function, the control signal training entry function, and the control signal training exit function. The number of the bits included in the control signal CA and logic levels of the bits included in the control signal CA may be set to be different according to the embodiments.

The control signal reference voltage setting function may be executed by an operation that sets a level of a reference voltage which is used to buffer the control signal CA in an input buffer (not illustrated) through which the control signal CA is inputted during the training operation (i.e., a training mode). A logic level combination of 'H, H, L, H, L, L' may be inputted through the bits CA0~CA5 of the control signal CA to execute the control signal reference voltage setting function, and a signal required to set the reference voltage may be inputted through the bits CA6~CA13 of the control signal CA. The logic level combination of the bits CA0~CA5 of the control signal CA for executing the control signal reference voltage setting function may be set to be different according to the embodiments.

The control signal termination resistance setting function may be executed by an operation that sets a resistance value of a termination resistor connected to a pad (not illustrated) to which the control signal is inputted during the training operation (i.e., the training mode). A logic level combination of 'H, H, L, H, L, H' may be inputted through the bits CA0~CA5 of the control signal CA to execute the control signal termination resistance setting function, and a signal required to set the resistance value of the termination resistor may be inputted through the bits CA6~CA13 of the control signal CA. The logic level combination of the bits CA0~CA5 of the control signal CA for executing the control signal termination resistance setting function may be set to be different according to the embodiments.

The chip selection signal training entry function may be executed to enter the chip selection signal training mode. A logic level combination of 'H, H, L, H, H, L, L' may be inputted through the bits CA0~CA6 of the control signal CA to execute the chip selection signal training entry function. Any logic levels of the bits CA7~CA13 of the control signal CA may be allowed to execute the chip selection signal training entry function, and the bits CA7~CA13 of the control signal CA are illustrated as blank spaces in the table of FIG. 6. The logic level combination of the bits CA0~CA13 of the control signal CA for executing the chip selection signal training entry function may be set to be different according to the embodiments.

The chip selection signal training exit function may be executed to terminate the chip selection signal training mode. A logic level combination of 'H, H, L, H, H, L, H' may be inputted through the bits CA0~CA6 of the control signal CA to execute the chip selection signal training exit function. Any logic levels of the bits CA7~CA13 of the control signal CA may be allowed to execute the chip selection signal training exit function, and the bits CA7~CA13 of the control signal CA are illustrated as blank spaces in the table of FIG. 6. The logic level combination of the bits CA0~CA13 of the control signal CA for executing the chip selection signal training exit function may be set to be different according to the embodiments.

The control signal training entry function may be executed to enter the control signal training mode. A logic level combination of 'H, H, L, H, H, H, L' may be inputted through the bits CA0~CA6 of the control signal CA to execute the control signal training entry function. Any logic levels of the bits CA7~CA13 of the control signal CA may be allowed to execute the control signal training entry function, and the bits CA7~CA13 of the control signal CA are illustrated as blank spaces in the table of FIG. 6. The logic level combination of the bits CA0~CA13 of the control signal CA for executing the control signal training entry function may be set to be different according to the embodiments.

The control signal training exit function may be executed to terminate the control signal training mode. A logic level combination of 'H, H, L, H, H, H, H' may be inputted through the bits CA0~CA6 of the control signal CA to execute the control signal training exit function. Any logic levels of the bits CA7~CA13 of the control signal CA may be allowed to execute the control signal training exit function, and the bits CA7~CA13 of the control signal CA are illustrated as blank spaces in the table of FIG. 6. The logic level combination of the bits CA0~CA13 of the control signal CA for executing the control signal training exit function may be set to be different according to the embodiments.

Figure 7:
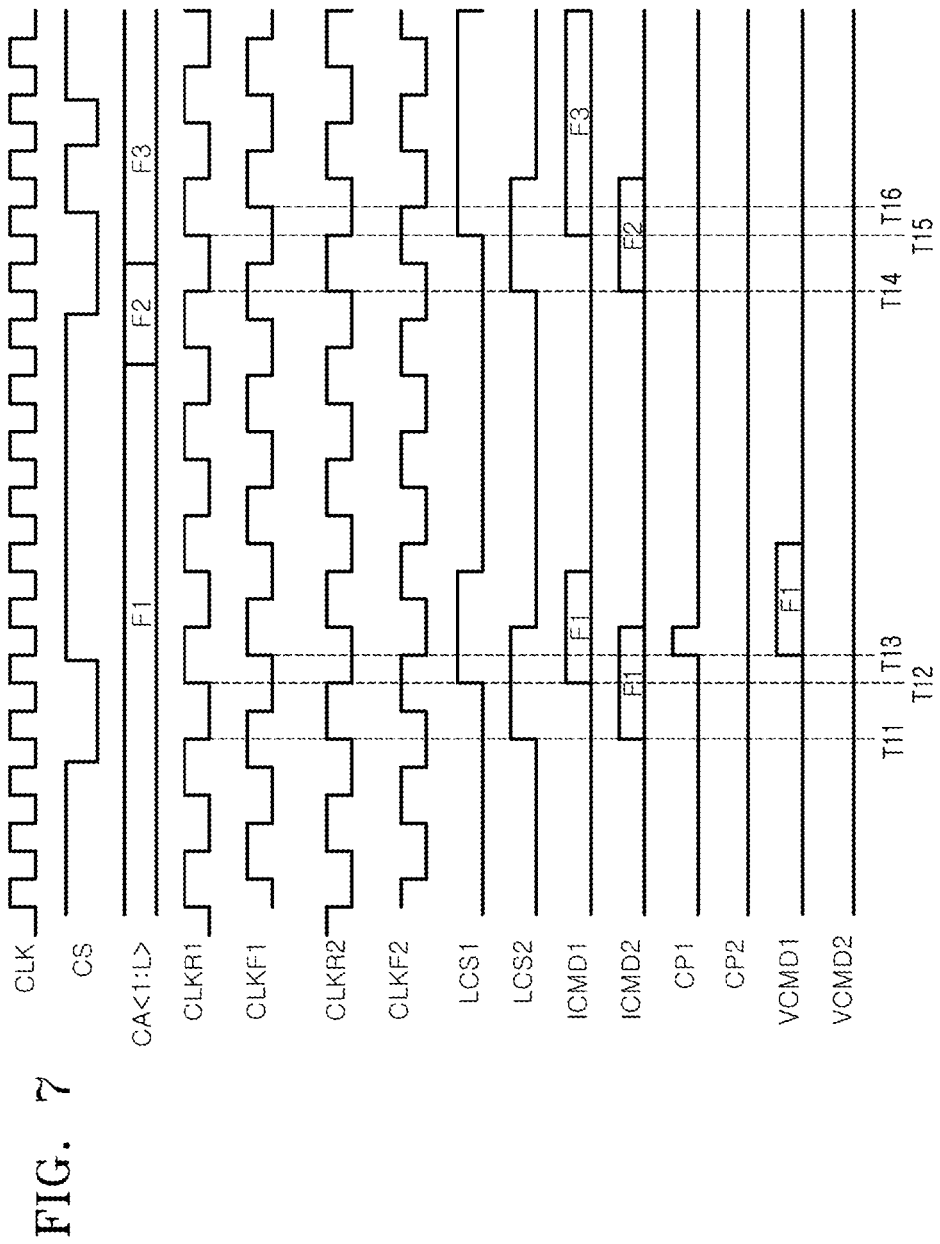
FIG. 7 is a timing diagram illustrating a representation of an example of an operation of the semiconductor device illustrated in FIG. 1.

An operation corresponding to the function of the valid command in the semiconductor device according to an embodiment will be described hereinafter with reference to FIG. 7.

At a point of time "T12", the chip selection signal CS enabled to have a logic "low" level may be inversely buffered in synchronization with a rising edge of the first division clock signal CLKR1, and the inversely buffered chip selection signal may be outputted as the first latch chip selection signal LCS1. At a point of time "T11", the chip selection signal CS enabled to have a logic "low" level may be inversely buffered in synchronization with a rising edge of the third division clock signal CLKR2, and the inversely buffered chip selection signal may be outputted as the second latch chip selection signal LCS2.

At the point of time "T12", a logic level combination of the control signal CA<1:L> for executing a first function F1 may be latched in synchronization with a rising edge of the first division clock signal CLKR1, and the first internal command ICMD1 may be generated to have the latched logic level combination of the control signal CA<1:L>. At the point of time "T11", the logic level combination of the control signal CA<1:L> for executing the first function F1 may be latched in synchronization with a rising edge of the third division clock signal CLKR2, and the second internal command ICMD2 may be generated to have the latched logic level combination of the control signal CA<1:L>.

At a point of time "T13", the first internal command ICMD1 and the second internal command ICMD2 may have the same logic level combination. This may mean that a logic level combination of the first latch control signal LCA1<1:L> used in generation of the first internal command ICMD1 is identical to a logic level combination of the second latch control signal LCA2<1:L> used in generation of the second internal command ICMD2. Thus, the first comparison pulse CP1 enabled in synchronization with a rising edge of the second division clock signal CLKF1 may be generated. The first internal command ICMD1 may be outputted as the first valid command VCMD1 by the first comparison pulse CP1 which is enabled. Since the first valid command VCMD1 is generated to have an enabled state, the first function F1 may be executed. The first function F1 may be set to be one of the control signal reference voltage setting function, the control signal termination resistance setting function, the chip selection signal training entry function, the chip selection signal training exit function, the control signal training entry function, and the control signal training exit function. The second comparison pulse CP2 generated in synchronization with a rising edge of the fourth division clock signal CLKF2 may maintain a disabled state.

At a point of time "T15", the chip selection signal CS enabled to have a logic "low" level may be inversely buffered in synchronization with a rising edge of the first division clock signal CLKR1, and the inversely buffered chip selection signal may be outputted as the first latch chip selection signal LCS1. At a point of time "T14", the chip selection signal CS enabled to have a logic "low" level may be inversely buffered in synchronization with a rising edge of the third division clock signal CLKR2, and the inversely buffered chip selection signal may be outputted as the second latch chip selection signal LCS2.

At the point of time "T15", a logic level combination of the control signal CA<1:L> for executing a third function F3 may be latched in synchronization with a rising edge of the first division clock signal CLKR1, and the first internal command ICMD1 may be generated to have the latched logic level combination of the control signal CA<1:L>. At the point of time "T14", the logic level combination of the control signal CA<1:L> for executing a second function F2 may be latched in synchronization with a rising edge of the third division clock signal CLKR2, and the second internal command ICMD2 may be generated to have the latched logic level combination of the control signal CA<1:L>.

At the point of time "T15", the first internal command ICMD1 may have a different logic level combination from the second internal command ICMD2. At a point of time "T16", the first comparison pulse CP1 generated in synchronization with a rising edge of the second division clock signal CLKF1 may maintain a disabled state. Thus, the first and second valid commands VCMD1 and VCMD2 enabled to execute a predetermined function may not be generated.

A training operation of a semiconductor device having an aforementioned configuration will be described hereinafter with reference to FIGS. 8 and 9.

Figure 8:
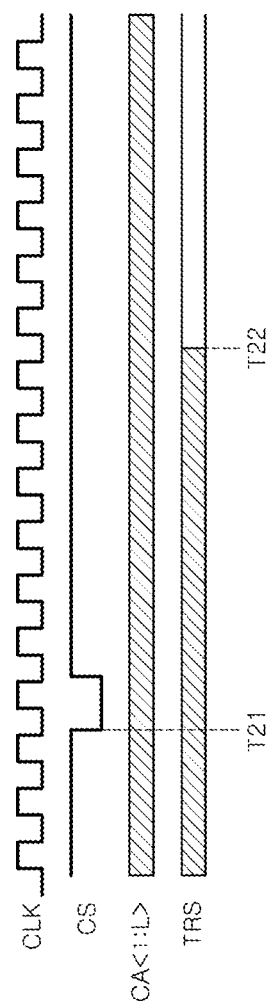
FIGS. 8 and 9 are timing diagrams illustrating representations of examples of a training operation executed in the semiconductor device illustrated in FIG. 1.

Referring to FIG. 8, the chip selection signal training operation may be executed to latch the chip selection signal CS enabled to have a logic "low" level at a point of time "T21" while a logic level combination of the control signal CA<1:L> is fixed and may be executed to control an enablement timing of the chip selection signal CS according to a logic level of the training result signal TRS which is generated from the latched chip selection signal CS from a point of time "T22".

Figure 9:
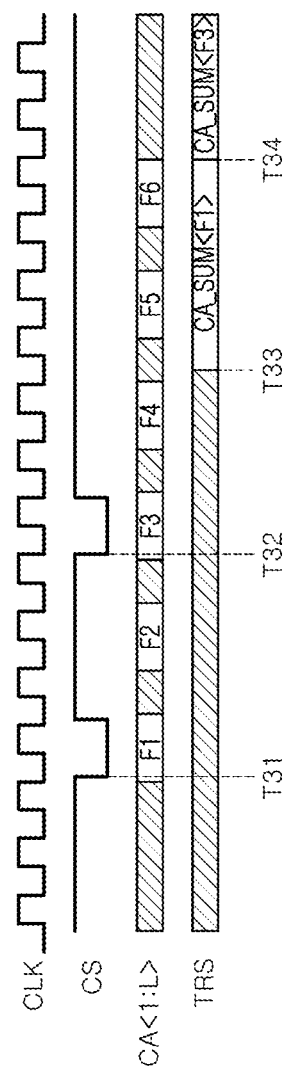

Referring to FIG. 9, the control signal training operation may be executed to latch a logic level combination of the control signal CA<1:L> for executing the first function F1 in synchronization with the chip selection signal CS inputted at a timing which is set by a training operation at a point of time "T31" and may be executed to control an input timing of the control signal CA<1:L> according to a logic level of the training result signal TRS which is generated from the latched control signal CA<1:L> at a point of time "T33". In addition, the control signal training operation may be executed to latch a logic level combination of the control signal CA<1:L> for executing the third function F3 in synchronization with the chip selection signal CS inputted at a timing which is set by the training operation at a point of time "T32" and may be executed to control an input timing of the control signal CA<1:L> according to a logic level of the training result signal TRS which is generated from the latched control signal CA<1:L> at a point of time "T34". FIG. 9 also illustrates second function F2, and fourth through sixth functions F4-F6 output as the control signal CA<1:L>. FIG. 9 also illustrates synthesis control signals CA_SUM<F1> and CA_SUM<F3> that may be output as the training result signal TRS.

Figure 10:
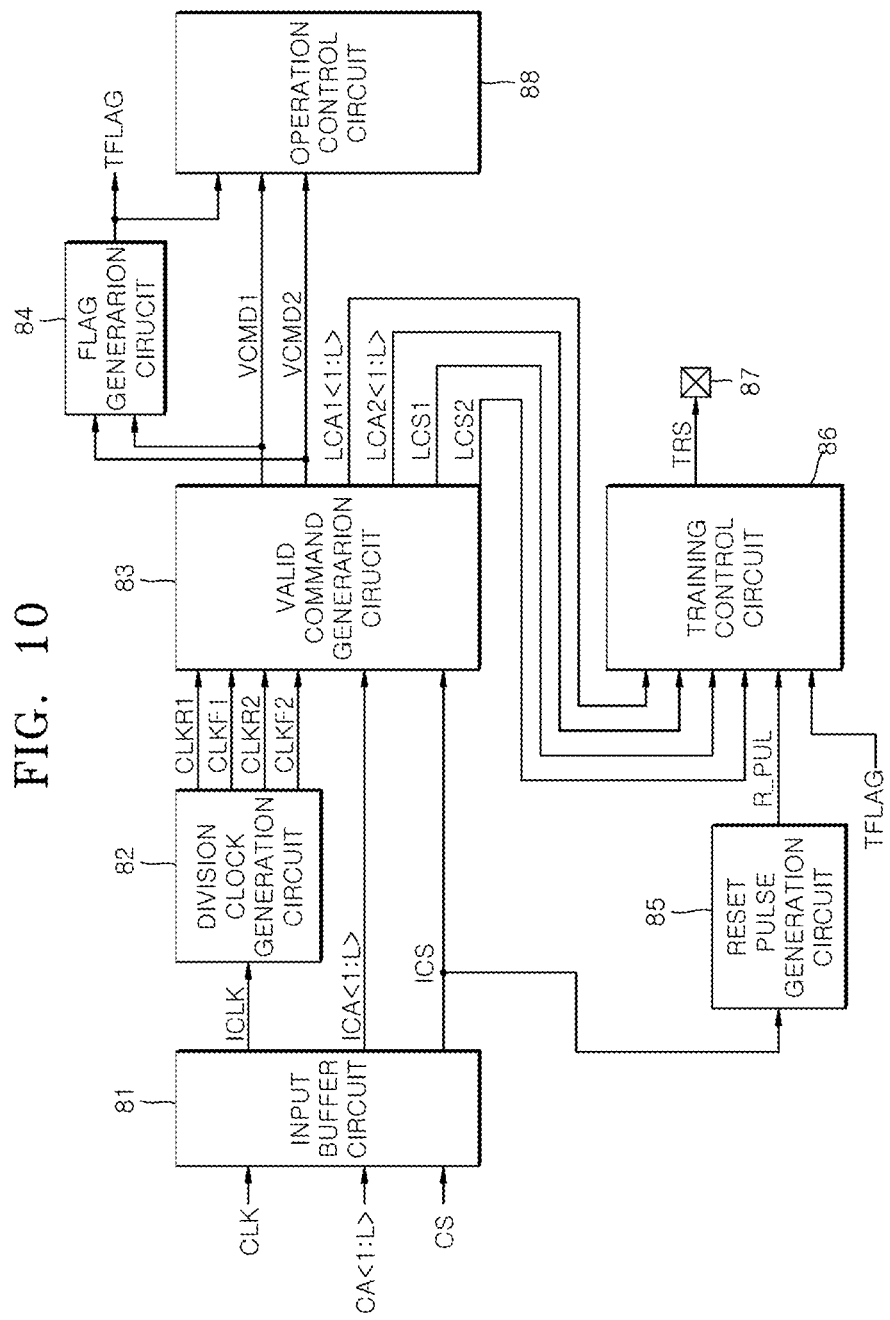
FIG. 10 is a block diagram illustrating a representation of an example of a configuration of a semiconductor device according to an embodiment.

Referring to FIG. 10, a semiconductor device according to an embodiment may include an input buffer circuit 81, a division clock generation circuit 82, a valid command generation circuit 83, a flag generation circuit 84, a reset pulse generation circuit 85, a training control circuit 86, an output pad 87 and an operation control circuit 88.

The input buffer circuit 81 may generate an internal clock signal ICLK, an internal control signal ICA<1:L> and an internal chip selection signal ICS in response to a clock signal CLK, a control signal CA<1:L> and a chip selection signal CS. The clock signal CLK may be provided by a controller (not illustrated) or a host (not illustrated) disposed at an outside region of the semiconductor device. The control signal CA<1:L> may be inputted to the input buffer circuit 81 through a line (not illustrated) that transmits a command or an address. The control signal CA<1:L> may be provided by the controller (not illustrated) or the host (not illustrated) disposed at an outside region of the semiconductor device. The chip selection signal CS may be enabled so that the semiconductor device is selected to execute a specific function. The chip selection signal CS may be provided by the controller (not illustrated) or the host (not illustrated) disposed at an outside region of the semiconductor device. The input buffer circuit 81 may include a buffer (not illustrated) that buffers the clock signal CLK to generate the internal clock signal ICLK. The input buffer circuit 81 may include a buffer (not illustrated) that buffers the control signal CA<1:L> to generate the internal control signal ICA<1:L>. The input buffer circuit 81 may include a buffer (not illustrated) that buffers the chip selection signal CS to generate the internal chip selection signal ICS.

The division clock generation circuit 82 may generate a first division clock signal CLKR1, a second division clock signal CLKF1, a third division clock signal CLKR2 and a fourth division clock signal CLKF2 from the internal clock signal ICLK. The first to fourth division clock signals CLKR1, CLKF1, CLKR2 and CLKF2 may be generated to be 2-division signals of the internal clock signal ICLK. That is, the first to fourth division clock signals CLKR1, CLKF1, CLKR2 and CLKF2 may be generated to have a cycle time which is twice a cycle time of the internal clock signal ICLK. In some embodiments, the first to fourth division clock signals CLKR1, CLKF1, CLKR2 and CLKF2 may be generated to be 'N'-division signals of the internal clock signal ICLK (wherein, 'N' denotes a natural number which is greater than three). The first and third division clock signals CLKR1 and CLKR2 may be generated in synchronization with rising edges of the internal clock signal ICLK, and the second and fourth division clock signals CLKF1 and CLKF2 may be generated in synchronization with falling edges of the internal clock signal ICLK. A phase of the first division clock signal CLKR1 may be set to precede a phase of the second division clock signal CLKF1 by 90 degrees. A phase of the second division clock signal CLKF1 may be set to precede a phase of the third division clock signal CLKR2 by 90 degrees. A phase of the third division clock signal CLKR2 may be set to precede a phase of the fourth division clock signal CLKF2 by 90 degrees. Even though a phase difference between the first to fourth division clock signals CLKR1, CLKF1, CLKR2 and CLKF2 is set to be 90 degrees in a present embodiment, the phase difference between the first to fourth division clock signals CLKR1, CLKF1, CLKR2 and CLKF2 may be set to be different according to the embodiments.

The valid command generation circuit 83 may generate a first latch control signal LCA1<1:L>, a second latch control signal LCA2<1:L>, a first latch chip selection signal LCS1, a second latch chip selection signal LCS2, a first valid command VCMD1 and a second valid command VCMD2 from the internal control signal ICA<1:L> and the internal chip selection signal ICS in synchronization with the first to fourth division clock signals CLKR1, CLKF1, CLKR2 and CLKF2. The valid command generation circuit 83 may latch the internal chip selection signal ICS to generate the first latch chip selection signal LCS1 in synchronization with the first division clock signal CLKR1. The valid command generation circuit 83 may latch the internal chip selection signal ICS to generate the second latch chip selection signal LCS2 in synchronization with the third division clock signal CLKR2. The valid command generation circuit 83 may latch the internal control signal ICA<1:L> to generate the first latch control signal LCA1<1:L> in synchronization with the first division clock signal CLKR1 and the first latch chip selection signal LCS1. The valid command generation circuit 83 may latch the internal control signal ICA<1:L> to generate the second latch control signal LCA2<1:L> in synchronization with the third division clock signal CLKR2 and the second latch chip selection signal LCS2. The valid command generation circuit 83 may generate the first valid command VCMD1 in synchronization with the second division clock signal CLKF1, if the first latch control signal LCA1<1:L> and the second latch control signal LCA2<1:L> have the same logic level combination. The valid command generation circuit 83 may generate the second valid command VCMD2 in synchronization with the fourth division clock signal CLKF2, if the first latch control signal LCA1<1:L> and the second latch control signal LCA2<1:L> have the same logic level combination. The valid command generation circuit 83 may generate the first valid command VCMD1 or the second valid command VCMD2 for executing a predetermined function, if the internal control signal ICA<1:L> is inputted to the valid command generation circuit 83 without any variation of a logic level combination in synchronization with the internal chip selection signal ICS for two cycles of the internal clock signal ICLK. In a present embodiment, the first and second valid command VCMD1 and VCMD2, which are enabled, may be generated if the internal control signal ICA<1:L> is inputted to the valid command generation circuit 83 without any variation of a logic level combination in synchronization with the internal chip selection signal ICS for two cycles of the internal clock signal ICLK. In some embodiments, the first and second valid command VCMD1 and VCMD2 may be generated, even though the internal control signal ICA<1:L> is inputted to the valid command generation circuit 83 without any variation of a logic level combination for two cycles of the internal clock signal ICLK regardless of the internal chip selection signal ICS. A logic level of the first and second valid commands VCMD1 and VCMD2 which are enabled may be set to be different according to the embodiments.

The flag generation circuit 84 may generate a flag TFLAG in response to the first and second valid commands VCMD1 and VCMD2. The flag generation circuit 84 may generate the flag TFLAG which is enabled if the first or second valid command VCMD1 or VCMD2 is enabled to execute a predetermined function. For example, the flag generation circuit 84 may generate the flag TFLAG which is enabled if the first or second valid command VCMD1 or VCMD2 is enabled for execution of a control signal training entry function. A logic level of the flag TFLAG which is enabled may be set to be different according to the embodiments.

The reset pulse generation circuit 85 may generate a reset pulse R_PUL in response to the internal chip selection signal ICS. The reset pulse generation circuit 85 may generate the reset pulse R_PUL which is enabled if a logic level of the internal chip selection signal ICS changes. For example, the reset pulse generation circuit 85 may generate the reset pulse R_PUL which is enabled at a point of time that a level of the internal chip selection signal ICS changes from a logic "high" level into a logic "low" level. The enablement of the reset pulse R_PUL means generation of a pulse. However, the reset pulse R_PUL which is enabled may correspond to a signal having a specific logic level according to the embodiments.

The training control circuit 86 may generate a training result signal TRS from the first latch control signal LCA1<1:L>, the second latch control signal LCA2<1:L>, the first latch chip selection signal LCS1 and the second latch chip selection signal LCS2, in response to the flag TFLAG and the reset pulse R_PUL. The training control circuit 86 may generate the training result signal TRS from the first latch control signal LCA1<1:L> or the second latch control signal LCA2<1:L> if the flag TFLAG is enabled by execution of the control signal training entry function. The control signal training entry function may be executed to control an input timing of the control signal CA<1:L> by sensing a logic level combination of the first or second latch control signal LCA1<1:L> or LCA2<1:L> which is outputted as the training result signal TRS in synchronization with a point of time that the trained chip selection signal CS is enabled. The training control circuit 86 may initialize the training result signal TRS if the reset pulse R_PUL is enabled. A logic level of the training result signal TRS initialized by the reset pulse R_PUL may be set to be different according to the embodiments. The training control circuit 86 may output the training result signal TRS through the output pad 87. In some embodiments, the output pad 87 may be realized using a pad through which data are outputted.

The operation control circuit 88 may receive the first and second valid commands VCMD1 and VCMD2 to execute predetermined function. The predetermined function executed by the first and second valid commands VCMD1 and VCMD2 may include, for example but not limited to, a control signal reference voltage setting function, a control signal termination resistance setting function, a chip selection signal training entry function, a chip selection signal training exit function, the control signal training entry function, and a control signal training exit function. The control signal reference voltage setting function may be executed by an operation that sets a level of a reference voltage which is used to buffer the control signal CA<1:L> in an input buffer (not illustrated) through which the control signal CA<1:L> is inputted during a training operation. The control signal termination resistance setting function may be executed by an operation that sets a resistance value of a termination resistor connected to a pad (not illustrated) to which the control signal is inputted during the training operation. The chip selection signal training entry function may be executed to enter the chip selection signal training mode, and the chip selection signal training exit function may be executed to terminate the chip selection signal training mode. The control signal training entry function may be executed to enter the control signal training mode, and the control signal training exit function may be executed to terminate the control signal training mode. Although each of the first and second valid commands VCMD1 and VCMD2 is illustrated and described as a single signal in a present embodiment, each of the first and second valid commands VCMD1 and VCMD2 may be realized to include a plurality of signals corresponding to different functions according to the embodiments.

Figure 11:
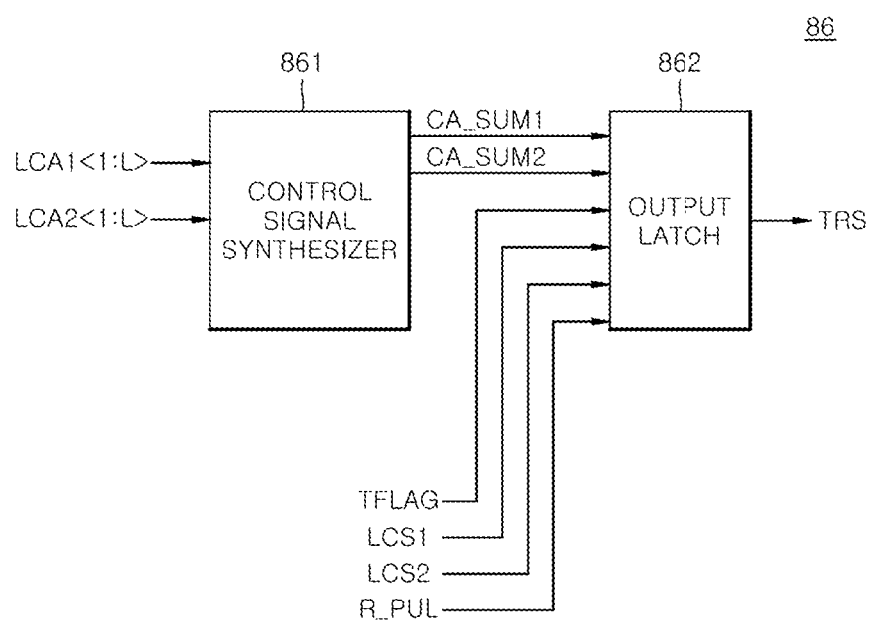
FIG. 11 is a block diagram illustrating a representation of an example of a training control circuit included in the semiconductor device of FIG. 10.

Referring to FIG. 11, the training control circuit 86 may include a control signal synthesizer 861 and an output latch 862.

The control signal synthesizer 861 may synthesize the first latch control signal LCA1<1:L> and the second latch control signal LCA2<1:L> to generate a first synthesis control signal CA_SUM1 and a second synthesis control signal CA_SUM2. The control signal synthesizer 861 may synthesize the first latch control signal LCA1<1:L> to generate the first synthesis control signal CA_SUM1. The first synthesis control signal CA_SUM1 may be generated to have a logic level which is set according to a logic level combination of bits included in the first latch control signal LCA1<1:L>. For example, the first synthesis control signal CA_SUM1 may be set to have a logic "high" level if all of the bits included in the first latch control signal LCA1<1:L> have the same logic level and may be set to have a logic "low" level if at least one of the bits included in the first latch control signal LCA1<1:L> has a different logic level from the other bits included in the first latch control signal LCA1<1:L>. The control signal synthesizer 861 may synthesize the second latch control signal LCA2<1:L> to generate the second synthesis control signal CA_SUM2. The second synthesis control signal CA_SUM2 may be generated to have a logic level which is set according to a logic level combination of bits included in the second latch control signal LCA2<1:L>. For example, the second synthesis control signal CA_SUM2 may be set to have a logic "high" level if all of the bits included in the second latch control signal LCA2<1:L> have the same logic level and may be set to have a logic "low" level if at least one of the bits included in the second latch control signal LCA2<1:L> has a different logic level from the other bits included in the second latch control signal LCA2<1:L>.

The output latch 862 may output the first synthesis control signal CA_SUM1 or the second synthesis control signal CA_SUM2 as the training result signal TRS in response to the flag TFLAG, the first latch chip selection signal LCS1 and the second latch chip selection signal LCS2. The output latch 862 may output the first synthesis control signal CA_SUM1 as the training result signal TRS if the first latch chip selection signal LCS1 is enabled, while the flag TFLAG is enabled to execute the control signal training entry function. The output latch 862 may output the second synthesis control signal CA_SUM2 as the training result signal TRS if the second latch chip selection signal LCS2 is enabled, while the flag TFLAG is enabled. The output latch 862 may initialize the training result signal TRS so that the training result signal TRS has a predetermined logic level, if the reset pulse R_PUL is enabled. A logic level of the training result signal TRS, which is initialized, may be set to be different according to the embodiments.

Figure 12:
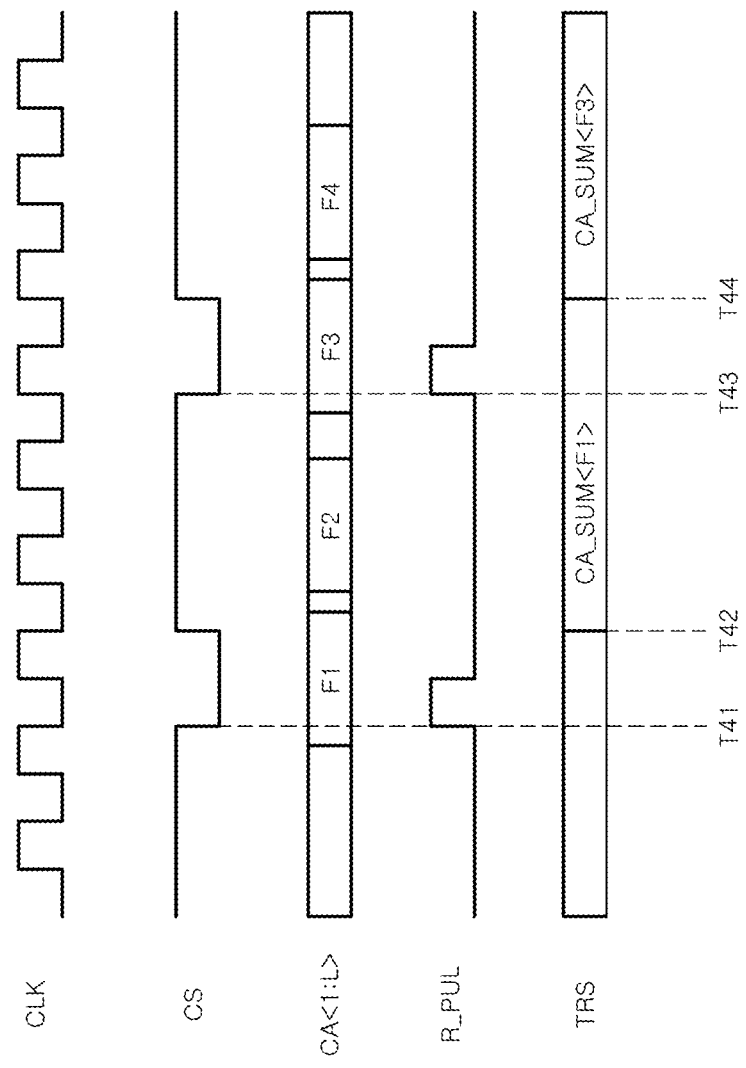
FIG. 12 is a timing diagram illustrating a representation of an example of a training operation executed in the semiconductor device illustrated in FIG. 10.

A control signal training operation of a semiconductor device having an aforementioned configuration will be described hereinafter with reference to FIG. 12.

At a point of time "T41", the control signal CA<1:L> having a logic level combination for a first function F1 may be latched in synchronization with the chip selection signal CS which is enabled and inputted at a timing which is set by a training operation. After the control signal CA<1:L> having a logic level combination for the first function F1 is latched, the latched control signal CA<1:L> may be synthesized to provide a synthesis control signal CA_SUM<F1>. At the point of time "T41", the reset pulse R_PUL enabled by the chip selection signal CS whose level changes from a logic "high" level into a logic "low" level may be generated and the training result signal TRS may be initialized by the reset pulse R_PUL to have a predetermined level. At a point of time "T42", the synthesis control signal CA_SUM<F1> may be output as the training result signal TRS which is used to control an input timing of the control signal CA<1:L>.

At a point of time "T43", the control signal CA<1:L> having a logic level combination for a third function F3 may be latched in synchronization with the chip selection signal CS which is enabled and inputted at a timing which is set by the training operation. After the control signal CA<1:L> having a logic level combination for the third function F3 is latched, the latched control signal CA<1:L> may be synthesized to provide a synthesis control signal CA_SUM<F3>. At the point of time "T43", the reset pulse R_PUL enabled by the chip selection signal CS whose level changes from a logic "high" level into a logic "low" level may be generated and the training result signal TRS may be initialized by the reset pulse R_PUL to have a predetermined level. At a point of time "T44", the synthesis control signal CA_SUM<F3> may be output as the training result signal TRS which is used to control an input timing of the control signal CA<1:L>. FIG. 12 also illustrates the control signal CA<1:L> having a logic level combination for the second function F2 and the fourth function F4.

As described above, a semiconductor device according to an embodiment may initialize the training result signal TRS according to the reset pulse R_PUL which is generated when a level transition of the chip selection signal CS occurs so that the training result signal TRS has a predetermined level. Thus, the semiconductor device may execute a training operation of the control signal CA<1:L> without training the chip selection signal CS when the control signal CA<1:L> having a different logic level combination for executing a different function is inputted. As a result, the training operations of the control signal CA<1:L> having various logic level combinations may be executed at a high speed. In addition, since the training operations of the control signal CA<1:L> having various logic level combinations are executed using only a circuit for generating the reset pulse R_PUL, a layout area of the semiconductor device may be reduced.

Figure 13:
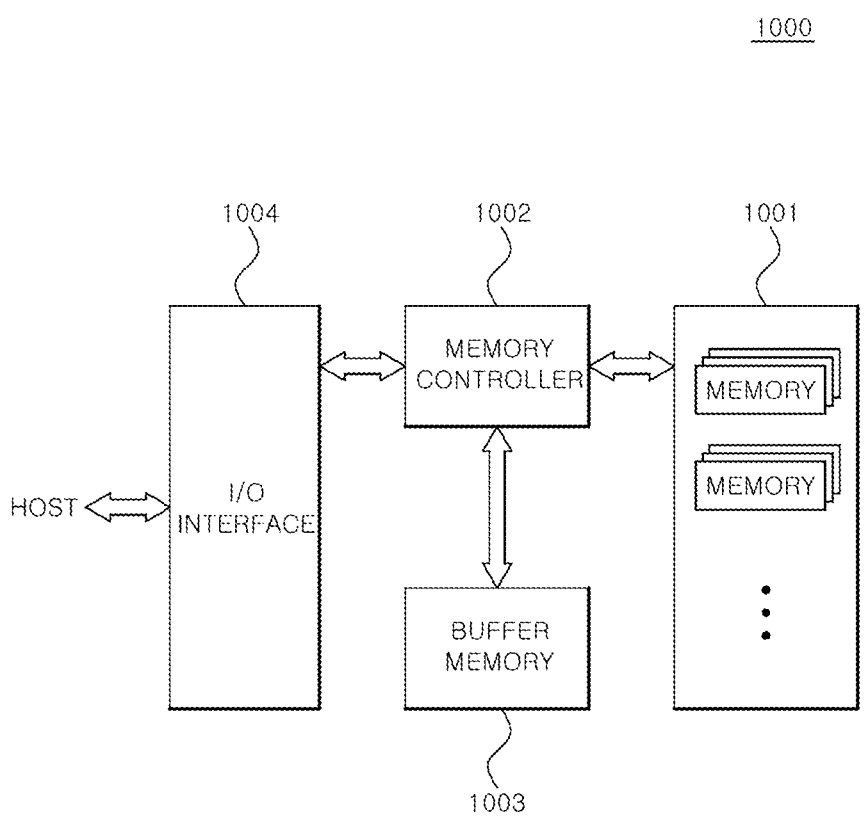
FIG. 13 is a block diagram illustrating a representation of an example of a configuration of an electronic system employing the semiconductor device illustrated in FIG. 1.

At least one of the semiconductor devices described with reference to FIGS. 1 and 10 may be applied to an electronic system that includes a memory system, a graphic system, a computing system, a mobile system, or the like. For example, as illustrated in FIG. 13, an electronic system 1000 according an embodiment may include a data storage circuit 1001, a memory controller 1002, a buffer memory 1003, and an input and output (input/output) (I/O) interface 1004.

The data storage circuit 1001 may store data which are outputted from the memory controller 1002 or may read and output the stored data to the memory controller 1002, according to a control signal generated by the memory controller 1002. The data storage circuit 1001 may include at least one of the semiconductor devices illustrated in or discussed with relation to FIGS. 1 and 10. The data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 5 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

As described above, a semiconductor device according to an embodiment may generate a valid command from a control signal which is availably inputted for at least two cycles of a clock signal. Thus, various functions of the valid command may be stably achieved even at a high operation speed of the semiconductor device.

In addition, the semiconductor device may reset a training result signal according to a reset pulse which is generated in synchronization with a chip selection signal to execute a training operation of the control signal at a high speed.

Moreover, a semiconductor device may execute various training operations of the control signal, logic level combinations of which are successively changed, using only a pulse generation circuit without any additional circuits. Thus, a layout area of the semiconductor device may be reduced.

What is claimed is:

1. A semiconductor device comprising:
a valid command generation circuit configured to latch an internal chip selection signal and an internal control signal in synchronization with a division clock signal to generate a latch chip selection signal and a latch control signal and configured to generate a valid command for executing a predetermined function from the latch control signal; and
a training control circuit configured to generate a training result signal from the latch chip selection signal or the latch control signal based on a flag,
wherein the valid command is enabled if a logic level combination of the latch control signal is fixed for N times a cycle of a clock signal, and
wherein N is a natural number.

2. The semiconductor device of claim 1, wherein the valid command for executing the predetermined function is generated if the internal control signal is inputted to the valid command generation circuit without any variation of a logic level combination in synchronization with the internal chip selection signal for at least two cycles of an internal clock signal.

3. The semiconductor device of claim 1, wherein the valid command for executing the predetermined function is generated if the internal control signal is inputted to the valid command generation circuit without any variation of a logic level combination in synchronization with the internal chip selection signal for at least two cycles of an internal clock signal regardless of the internal chip selection signal.

4. The semiconductor device of claim 1,
wherein the division clock signal is generated by dividing a clock signal,
wherein a cycle of the division clock signal is N times a cycle of the clock signal, and
wherein N is a natural number.

5. The semiconductor device of claim 1,
wherein the division clock signal includes first to fourth division clock signals,
wherein the first and third division clock signals are generated in synchronization with rising edges of a clock signal,
wherein the second and fourth division clock signals are generated in synchronization with falling edges of the clock signal,
wherein a phase of the first division clock signal precedes a phase of the second division clock signal,
wherein a phase of the second division clock signal precedes a phase of the third division clock signal, and
wherein a phase of the third division clock signal precedes a phase of the fourth division clock signal.

6. The semiconductor device of claim 1,
wherein the division clock signal includes a first division clock signal and a third division clock signal which are generated in synchronization with rising edges of a clock signal, and
wherein the valid command generation circuit includes an input latch circuit configured to latch the internal chip selection signal in synchronization with the first division clock signal to generate a first latch chip selection signal and configured to latch the internal chip selection signal in synchronization with the third division clock signal to generate a second latch chip selection signal.

7. The semiconductor device of claim 1,
wherein the division clock signal includes a first division clock signal and a third division clock signal which are generated in synchronization with rising edges of a clock signal,
wherein the latch chip selection signal includes a first latch chip selection signal latched in synchronization with the first division clock signal and includes a second latch chip selection signal latched in synchronization with the third division clock signal, and
wherein the valid command generation circuit includes an input latch circuit configured to latch the internal control signal to generate a first latch control signal based on the first division clock signal and the first latch chip selection signal and configured to latch the internal control signal to generate a second latch control signal based on the third division clock signal and the second latch chip selection signal.

8. The semiconductor device of claim 1,
wherein the division clock signal includes a second division clock signal and a fourth division clock signal which are generated in synchronization with falling edges of a clock signal,
wherein the latch control signal includes a first latch control signal and a second latch control signal, and
wherein the valid command generation circuit includes a comparison and output (comparison/output) circuit configured to compare a logic level combination of the first latch control signal with a logic level combination of the second latch control signal in synchronization with the second division clock signal or the fourth division clock signal to generate a first valid command or a second valid command.

9. The semiconductor device of claim 8, wherein the comparison/output circuit includes:
a first comparator configured to generate a first comparison pulse which is enabled if the first and second latch control signals inputted in synchronization with the second division clock signal have the same logic level combination; and
a first latch and output (latch/output) circuit configured to output a first internal command as the first valid command based on the first comparison pulse.

10. The semiconductor device of claim 9, wherein the first internal command is generated by decoding the first latch control signal.

11. The semiconductor device of claim 9, wherein the comparison/output circuit includes:
a second comparator configured to generate a second comparison pulse which is enabled if the first and second latch control signals inputted in synchronization with the fourth division clock signal have the same logic level combination; and
a second latch/output circuit configured to output a second internal command as the second valid command based on the second comparison pulse.

12. The semiconductor device of claim 8, further comprising:
a flag generation circuit configured to generate a first flag enabled if the first valid command or the second valid command is enabled to execute a chip selection signal training entry function and to generate a second flag enabled if the first valid command or the second valid command is enabled to execute a control signal training entry function.

13. The semiconductor device of claim 1,
wherein the flag includes a first flag and a second flag,
wherein the first flag is enabled for a chip selection signal training entry function, and
wherein the second flag is enabled for a control signal training entry function.

14. The semiconductor device of claim 13, wherein the training control circuit includes a first selector that outputs a first latch chip selection signal or a first synthesis control signal as a first selection signal based on the first and second flags.

15. The semiconductor device of claim 14,
wherein the division clock signal includes a first division clock signal generated in synchronization with a rising edge of a clock signal and a second division clock signal generated in synchronization with a falling edge of a clock signal,
wherein the latch chip selection signal includes the first latch chip selection signal latched in synchronization with the first division clock signal, and
wherein the first synthesis control signal is generated by synthesizing a first latch control signal which is generated by latching the internal control signal based on the first division clock signal and the first latch chip selection signal.

16. The semiconductor device of claim 14, wherein the training control circuit further includes a second selector that outputs a second latch chip selection signal or a second synthesis control signal as a second selection signal based on the first and second flags.

17. The semiconductor device of claim 16, wherein the training control circuit further includes an output latch configured to output the first selection signal or the second selection signal as the training result signal based on a synthesis flag, the first latch chip selection signal and the second latch chip selection signal.

18. The semiconductor device of claim 17, wherein the synthesis flag is enabled if the first flag or the second flag is enabled.

19. The semiconductor device of claim 1, wherein the predetermined function includes, one or more of, a control signal reference voltage setting function, a control signal termination resistance setting function, a chip selection signal training entry function, a chip selection signal training exit function, a control signal training entry function, and a control signal training exit function.

20. A semiconductor device comprising:
a valid command generation circuit configured to latch an internal control signal in synchronization with a division clock signal to generate a latch control signal and configured to generate a valid command for executing a predetermined function from the latch control signal; and
a training control circuit configured to generate a training result signal from the latch control signal based on a flag,
wherein the valid command is enabled if a logic level combination of the latch control signal is fixed for N times a cycle of a clock signal, and
wherein N is a natural number.

21. The semiconductor device of claim 20, wherein the valid command for executing the predetermined function is generated if the internal control signal is inputted to the valid command generation circuit without any variation of a logic level combination in synchronization with an internal chip selection signal for at least two cycles of an internal clock signal.

22. The semiconductor device of claim 20, wherein the valid command for executing the predetermined function is generated if the internal control signal is inputted to the valid command generation circuit without any variation of a logic level combination in synchronization with an internal chip selection signal for at least two cycles of an internal clock signal regardless of the internal chip selection signal.

23. The semiconductor device of claim 20,
wherein the division clock signal is generated by dividing a clock signal,
wherein a cycle of the division clock signal is N times a cycle of the clock signal,
wherein N is a natural number,
wherein the division clock signal includes first to fourth division clock signals,
wherein the first and third division clock signals are generated in synchronization with rising edges of the clock signal,
wherein the second and fourth division clock signals are generated in synchronization with falling edges of the clock signal,
wherein a phase of the first division clock signal precedes a phase of the second division clock signal,
wherein a phase of the second division clock signal precedes a phase of the third division clock signal, and
wherein a phase of the third division clock signal precedes a phase of the fourth division clock signal.

24. The semiconductor device of claim 20,
wherein the division clock signal includes a first division clock signal and a third division clock signal which are generated in synchronization with rising edges of a clock signal,
wherein the division clock signal further includes a second division clock signal and a fourth division clock signal which are generated in synchronization with falling edges of a clock signal, and
wherein the valid command generation circuit includes:
an input latch circuit configured to latch the internal control signal to generate a first latch control signal based on the first division clock signal and configured to latch the internal control signal to generate a second latch control signal based on the third division clock signal; and
a comparison and output (comparison/output) circuit configured to compare a logic level combination of the first latch control signal with a logic level combination of the second latch control signal in synchronization with the second division clock signal or the fourth division clock signal to generate a first valid command or a second valid command.

25. The semiconductor device of claim 24, wherein the comparison/output circuit includes:
a first comparator configured to generate a first comparison pulse which is enabled if the first and second latch control signals inputted in synchronization with the second division clock signal have the same logic level combination;
a first latch/output circuit configured to output a first internal command as the first valid command based on the first comparison pulse;
a second comparator configured to generate a second comparison pulse which is enabled if the first and second latch control signals inputted in synchronization with the fourth division clock signal have the same logic level combination; and a second latch/output circuit configured to output a second internal command as the second valid command based on the second comparison pulse.

26. The semiconductor device of claim 20, wherein the flag is enabled for a control signal training entry function.

27. The semiconductor device of claim 20, wherein the training control circuit is configured to generate a synthesis control signal by synthesizing a latch control signal which is generated by latching the internal control signal based on the division clock signal and configured to output the synthesis control signal as the training result signal if the flag is enabled.

28. The semiconductor device of claim 20, wherein the predetermined function includes, one or more of, a control signal reference voltage setting function, a control signal termination resistance setting function, a chip selection signal training entry function, a chip selection signal training exit function, a control signal training entry function, and a control signal training exit function.

29. A semiconductor device comprising:
a valid command generation circuit configured to latch an internal chip selection signal and an internal control signal in synchronization with a division clock signal to generate a latch chip selection signal and a latch control signal and configured to generate a valid command for executing a predetermined function from the latch control signal;
a reset pulse generation circuit configured to generate a reset pulse based on the internal chip selection signal; and
a training control circuit configured to generate a training result signal from the latch control signal based on a flag and configured to initialize the training result signal based on the reset pulse.

30. The semiconductor device of claim 29, wherein the reset pulse generation circuit generates the reset pulse enabled in synchronization with a point of time that a level transition of the internal chip selection signal occurs.

31. The semiconductor device of claim 29, wherein the training control circuit includes an output latch configured to output a first synthesis control signal or a second synthesis control signal as the training result signal based on the flag and the latch chip selection signal.

* * * * *